(12) United States Patent
Elian et al.

(10) Patent No.: US 9,728,652 B2
(45) Date of Patent: Aug. 8, 2017

(54) SENSOR DEVICE AND METHOD (75) Inventors: Klaus Elian, Alteglofsheim (DE); Franz-Peter Kalz, Regensburg (DE); Horst Theuss, Wenzenbach (DE)

(73) Assignee: Infineon Technologies AG, Neubiberg (DE)

( * ) Notice: Subject to any disclaimer, the term of this patent is extended or adjusted under 35 U.S.C. 154(b) by 632 days.

(21) Appl. No.: 13/358,316

(22) Filed: Jan. 25, 2012

(65) Prior Publication Data
US 2013/0187201 A1 Jul. 25, 2013

(51) Int. Cl.
*H01L 29/84* (2006.01)
*H01L 29/66* (2006.01)
*B81C 1/00* (2006.01)
*G01P 15/12* (2006.01)
*G01L 1/20* (2006.01)

(52) U.S. Cl.
CPC .......... *H01L 29/84* (2013.01); *B81C 1/00246* (2013.01); *G01L 1/20* (2013.01); *G01P 15/124* (2013.01); *B81B 2201/025* (2013.01); *B81B 2201/0235* (2013.01); *B81B 2201/0292* (2013.01); *B81B 2203/0361* (2013.01)

(58) Field of Classification Search
CPC ..... B81B 3/00; B81B 7/02; B81B 2201/0235; B81B 2201/025; B81B 2201/0292; B81B 2203/0361; B81C 1/00; H01L 29/84
USPC .............................................. 257/254; 3/254
See application file for complete search history.

(56) References Cited

U.S. PATENT DOCUMENTS

| 5,279,162 A * | 1/1994 | Takebe ................ G01P 15/0802 257/26 |
| 5,600,074 A * | 2/1997 | Marek ....................... G01L 1/18 257/419 |
| 7,644,624 B2 * | 1/2010 | Liu et al. ........................ 73/756 |
| 8,450,800 B2 | 5/2013 | Inomata |
| 8,524,482 B1 * | 9/2013 | Wick ...................... C12N 7/00 424/184.1 |
| 8,569,092 B2 | 10/2013 | Mantravadi et al. |
| 2005/0190152 A1* | 9/2005 | Vaganov ................. G06F 3/0338 345/157 |
| 2008/0072683 A1* | 3/2008 | Liu ....................... B81B 3/0021 73/774 |
| 2009/0057896 A1 | 3/2009 | Su |
| 2009/0212377 A1* | 8/2009 | Vaganov et al. .............. 257/415 |
| 2009/0230441 A1* | 9/2009 | Schwarzmann ........ H01L 29/84 257/288 |

(Continued)

FOREIGN PATENT DOCUMENTS

CN 101669026 A 3/2010
CN 102157679 A 8/2011

(Continued)

OTHER PUBLICATIONS

Jaeger Richard C.: "CMOS Stress Sensors on (100) Silicon", In: IEEE Journal of Solid-State Circuits, 2000, vol. 35, No. 1, S. 85-95.*

(Continued)

*Primary Examiner* — A. Sefer
*Assistant Examiner* — Benjamin Tzu-Hung Liu
(74) *Attorney, Agent, or Firm* — Slater Matsil, LLP (57) ABSTRACT

A sensor device includes a semiconductor chip. The semiconductor chip has a sensing region sensitive to mechanical loading. A pillar is mechanically coupled to the sensing region.

18 Claims, 5 Drawing Sheets

(56) References Cited

U.S. PATENT DOCUMENTS

2010/0066547 A1* 3/2010 Chowdhury ............ C02F 1/008
340/603

FOREIGN PATENT DOCUMENTS

| CN | 102194882 A | 9/2011 |
| CN | 102292692 A | 12/2011 |
| JP | 63-018272 | * 1/1988 |

OTHER PUBLICATIONS

Jaeger, Richard C. "CMOS stress Sensors on (100) Silicon", IEEE Journal of Solid-State Circuits, 2000, vol. 35, No. 1, S. 85-95.*
Jaeger et al. "CMOS Stress Sensors on (100) Silicon", IEEE Journal of Solid-State Circuits, vol. 35, No. 1, Jan. 2000, p. 85-93.*
Jaeger et al. "CMOS Stress Sensors on (100) Silicon", IEEE Journal of Solid-State Circuits, vol. 35. No. 1, Jan. 2000, p. 85-93.*
Große, S., et al., "The Micro-Pillar Shear-Stress Sensor $MPS^3$ for Turbulent Flow," Sensors, vol. 9, Issue No. 4, doi: 10.3390/s90402222, ISSN 1424-8220, Mar. 2009, pp. 2222-2251.

* cited by examiner

| Providing a semiconductor chip, the semiconductor chip having at least one sensing region sensitive to mechanical loading | ~ S1 |

↓

| Generating at least one pillar mechanically coupled to the at least one sensing region | ~ S2 | fig. 13

SENSOR DEVICE AND METHOD

TECHNICAL FIELD

The invention relates to a sensor device and, in particular embodiments, to techniques of sensing mechanical loading such as force, pressure, tension, stress, bending, deflection, strain, elongation, acceleration, etc.

BACKGROUND

In the development of sensor devices special requirements may be taken into account, in particular when designing the functionality, sensitivity and the package of a sensor device. Both the manufacturers and the consumers of sensor devices desire devices that are inexpensive, reduced in size and yet have increased device functionality.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION OF ILLUSTRATIVE EMBODIMENTS

In the following detailed description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this specification, the terms "coupled" and/or "connected" are not meant to mean in general that the elements must be directly coupled or connected together; intervening elements may be provided between the "coupled" or "connected" elements. However, although not restricted to that meaning, the terms "coupled" and/or "connected" may also be understood to optionally disclose an implementation in which the elements are directly coupled or connected together without intervening elements provided between the "coupled" or "connected" elements. This applies both to mechanical and electrical coupling or connection.

Embodiments of sensor devices which contain a semiconductor chip are described below. The semiconductor chip may be of different types, may be manufactured by different technologies and may include, for example, integrated electrical, electro-optical or electro-mechanical circuits and/or passives. The semiconductor chip may, for example, be designed to include one or more of a logic integrated circuit, an analog integrated circuit, a mixed signal integrated circuit, a memory circuit or integrated passives. The semiconductor chip may include control circuits, microprocessors or microelectro-mechanical components. The semiconductor chip need not be manufactured from specific semiconductor material, for example, Si, SiC, SiGe, GaAs, AlGaAs and, furthermore, may contain inorganic and/or organic materials that are not semiconductors, such as, for example, insulators, plastics or metals.

The sensor devices described herein may comprise a sensing region susceptive to mechanical loading. Mechanical loading may be applied to the sensing region by a force acting thereon. The force may, e.g., be associated with stress such as, e.g., pressure, bending, deflection, tension, etc., acting on the sensing region.

The sensor devices described herein may comprise one or more pillars mechanically coupled to the semiconductor chip. The mechanical coupling between the pillar(s) and the semiconductor chip may be configured to transfer a force from the pillar(s) to the semiconductor chip. By way of example, a force closure connection may be implemented between the pillar(s) and the lattice of the semiconductor chip. Typically, such a force-locked connection may be adapted to introduce stress in the semiconductor lattice upon actuation of the pillar(s).

The sensor devices described herein may use various techniques of sensing mechanical loading on a sensing region of a semiconductor chip. The sensor devices described below may sense a variety of quantities such as, e.g., the quantities mentioned above. They may further sense quantities which are converted into a force, such as, e.g., expansion/contraction, acceleration, flow rate, number of particles, etc. Further, they may be used in a variety of different applications such as, e.g., displacement or strain measurement sensor, flowmeter for fluids, particle counter, acceleration sensor etc. Further, quantities may be measured directional, i.e., the various sensor devices may typically allow for directional measurements.

Figure 1:
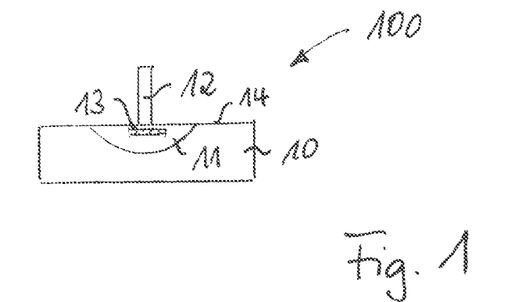
FIG. 1 schematically illustrates a top view of a sensor chip having a sensing region in accordance with one embodiment.

FIG. 1 schematically illustrates a sensor device 100 in cross-section. The sensor device 100 includes a semiconductor chip 10 having a sensing region 11. Further, the sensor device 100 may include a pillar 12 which is mechanically coupled to the sensing region 11.

The sensing region 11 of the semiconductor chip 10 is sensitive to mechanical loading. By way of example, the sensing region 11 may be configured to embed one or more integrated circuit device 13 sensitive to stress applied to the sensing region 11 of the semiconductor chip 10.

In some embodiments the stress-sensitive integrated circuit devices 13 may be implemented by one or more transistors. By way of example, channel transistors, such as, e.g., MOSFETs (Metal-Oxide-Semiconductor Field-Effect Transistors), show electrical characteristics which are dependent from stress applied to the channel region of the transistor. More specifically, the electrical conductivity of channel transistors depends on the amount and direction (relative to the extension of the channel) of stress present in the sensing region 11 of the semiconductor chip 10.

The pillar 12 is configured to transfer mechanical stress to the sensing region 11 of the semiconductor chip 10 and to introduce the stress into the sensing region 11 of the semiconductor chip 10 comprising the stress-sensitive integrated circuit device 13. It is to be noted that the pillar 12 may be configured to transfer directional stress to the sensing region 11. More specifically, the pillar 12 may be configured to transfer stress acting as pressure or tension in a direction perpendicular to an upper surface 14 of the semiconductor chip 10. Further, the pillar 12 may be configured to transfer and introduce mechanical stress into the sensing region 11 which is oriented substantially parallel to the upper surface 14 of the semiconductor chip 10. By way of example, such lateral stress may be generated by a lateral deflection of the pillar 12. Further, it is to be noted that the direction of stress transferred by the pillar 12 and introduced into the sensing region 11 may be composed of a first component in a direction perpendicular to the upper surface 14, a second component in a direction parallel to the upper surface 14 of the semiconductor chip 10 and a third component (e.g., an angular component, if polar coordinates are used) which indicates the direction of the stress in a plane defined by the upper surface 14 of the semiconductor chip 10. The stress-sensitive integrated circuit device 13 may be responsive to one or more of these components of the directional stress applied to the sensing region 11. Therefore, the sensing region 11 may be sensitive also to directional changes of the stress exerted on the sensing region 11 by virtue of the pillar 12, which is mechanically coupled to the sensing region 11.

The semiconductor chip 10 may be of any semiconductor material such as, e.g., IV-semiconductors such as, e.g., Si, SiC, SiGe, III-V compound semiconductors such as, e.g., GaN, AlN, InN, GaP, AlP, InP, GaAs, AlAs, InAs, GaSb, AlSb, InSb and fractional compositions thereof, and II-VI compound semiconductors such as, e.g., CdTe, CdSe, CdS, ZnTe, ZnSe, ZnS. Further, the semiconductor material may be doped.

The pillar 12 may be made of any material configured to mechanically load the sensing region 11. By way of example, as will be explained in more detail further below, the pillar 12 may, e.g., be made of a dielectrical material, a polymer material such as, e.g., silicone-based material or a photoresist, a semiconductor material or a metal or metal alloy.

The pillar 12 may be fixedly secured to the upper surface 14 of the semiconductor chip 10. That way, stress transferred along the pillar 12 is effectively introduced into a sensing region 11 of the semiconductor chip 10.

In one embodiment a sensing region 11 of the semiconductor chip 10 is a bulk part of the semiconductor chip 10, in which the stress-sensitive integrated circuit device 13 is implemented as, e.g., an integrated circuit. That way, mechanical loading of the sensing region 11 may induce a strain or deformation in the lattice which varies the electrical characteristic or response of the stress-sensitive integrated circuit device 13.

In some embodiments the sensing region 11 may be implemented by a micro-mechanical part such as, e.g., a membrane. In this case, a displacement of the membrane caused by stress transferred and applied by the pillar 12 to the micro-mechanical part may be converted into electrical signals by way of displacement sensing elements such as, e.g., piezoelectric elements.

Figure 2:
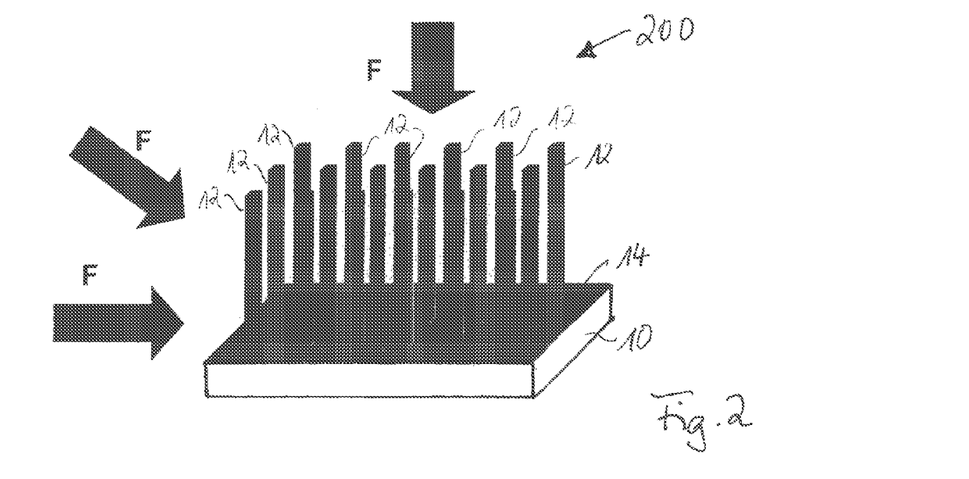
FIG. 2 schematically illustrates a perspective view of a semiconductor chip and a multi-pillar structure in accordance with one embodiment.

Without loss of generality in the following, the sensing region 11 may be assumed to comprise a semiconductor lattice region, i.e., no MEMS (Micro-Electro-Mechanical System). FIG. 2 is a schematic illustration of a sensor device 200 in accordance with one embodiment. The sensor device 200 may comprise a semiconductor chip 10 and an array of pillars 12 bonded to the semiconductor chip 10. The disclosure to sensor device 100 may also apply to the sensor device 200 and a corresponding description is omitted in order to avoid reiteration. Vice versa, the disclosure to design and manufacture pillars 12 and/or semiconductor chips 10 provided below is also applicable to sensor device 100. In FIG. 2, forces F having various directions are illustrated to act on the pillars 12.

The array of pillars 12 may have any geometrical outline, e.g., polygonal, square, circle-shaped, etc. The array of pillars 12 may extend over a substantial part of the upper surface 14 of the semiconductor chip 10, e.g., over an area greater than ⅓, ½, ⅔, ¾ of the area of the upper surface 14.

Each pillar 12 of the array of pillars 12 may be designed as, e.g., a cylindrical structure or a structure having another cross-section such as, e.g., polygonal, square, etc. Each pillar 12 may have a height of about 50-2000 µm, more particularly 150-1000 µm, still more particularly 250-700 µm. Further, each pillar 12 may have a maximum lateral dimension (e.g., diameter, lateral side length) of 10-1500 µm, more particularly 25-400 µm, still more particularly 40-300 µm. The height of a pillar 12 may be greater than or equal to the maximum lateral dimension thereof. The pitch or center-to-center distance between adjacent pillars 12 may be about 50-1500 µm, more particularly between 80-500 µm, and, still more particularly, between 100-300 µm, depending, e.g., on the lateral dimension of a pillar 12.

The aspect ratio of a pillar 12 may be, e.g., between 5-40, more particularly 10-25, or may have values beyond these ranges.

A pillar 12 or the array of pillars 12 may be fabricated in many ways. In some embodiments, photolithography techniques may be employed. By way of example, the pillars 12 may be made of a photoresist such as, e.g., SU8 or another photosensitive material. In this case, a layer of photoresist (not shown) is deposited over the upper surface 14 of the semiconductor chip 10. The thickness of the layer of photoresist may correspond to the height of the pillars 12. The photoresist may be applied by spin coating or any other common method.

After the application of the photoresist layer, the photoresist layer may be prebaked. Subsequently, the photoresist layer may be structured by exposure and developed using a mask. Optionally, a CAR (Chemically Amplified Resist) chemistry may be used. Such techniques are also known as CARL (Chemical Amplification of Resist Lines) in the art.

After exposure and developing, the photoresist may be etched to either remove the exposed or unexposed parts of the photoresist. As a result, the pillar(s) 12 are formed out of the photoresist layer.

Further, structuring of a layer of pillar material applied on the upper surface 14 may be, e.g., accomplished by using direct laser structuring techniques or photoresist mask techniques. Virtually all materials which may, e.g., be ablated by laser irradiation or etched through a pre-structured mask may be used for pillar construction, e.g., polymer materials, dielectric materials, semiconductor materials, metals or metal alloys, etc.

In some embodiments the pillar(s), i.e., one pillar 12 or an array of pillars 12, may be fabricated by using electroplating. By way of example, a lithography, electro-plating, and molding process may be applied. Methods of that kind are also referred to by the German acronym LIGA (LIthographie, Galvanik, Abformung) in the art. They are known to create high aspect-ratio microstructures comprised of metal or metal alloy. The LIGA process may comprise the steps of masking a substrate, exposure, development, electroplating and resist stripping. Electroplating may, e.g., be accomplished by plating a metal or a metal alloy into voids left by removed photoresist material. The technique of using electroplating for forming the pillars allows for the fabrication of an array of pillars 12 comprising a metal, such as, e.g., nickel, copper, gold or a metal alloy, etc. Pillars 12 comprising metal may have mechanical properties different from the mechanical properties of pillars 12 made of a polymer, dielectric or semiconductor material, and may therefore be of particular interest in some applications. Further, the pillar 12 or array of pillars 12 may also be made of dielectric material such as, e.g., a layer of semiconductor or insulating material. By way of example, a semiconductor material, which may be, e.g., identical to the semiconductor material of the semiconductor chip 10, may be applied to or deposited over the upper surface 14 of the semiconductor chip 10. Alternatively, an insulating layer such as, e.g., a hard passivation layer (e.g., a nitride layer, a silicon oxide layer, a metal oxide layer, etc.) may be applied to the upper surface 14 of the semiconductor chip 10 and structured into a pillar 12 or a pillar array using techniques known in the art. In this case, pillar(s) 12 of, e.g., high stiffness may be generated.

In some embodiments, the pillar(s) 12 may be generated by molding. By way of example, a mold layer made of, e.g., wax or another structurable material may be deposited on the upper surface 14 of the semiconductor chip 10. The mold layer may then be structured, e.g., perforated with holes, by using, e.g., laser irradiation or another structuring technique. The holes may then be filled by the pillar material, e.g., by a polymer material such as, e.g., a resin, an elastomer, e.g., a PDMS (polydimethylsiloxane) elastomer. The polymer material may then be cured by the application of energy. Subsequently, the mold layer may be removed by any appropriate technique, e.g., peel-off, wash-off, to uncover the pillar(s) 12.

Figure 3:
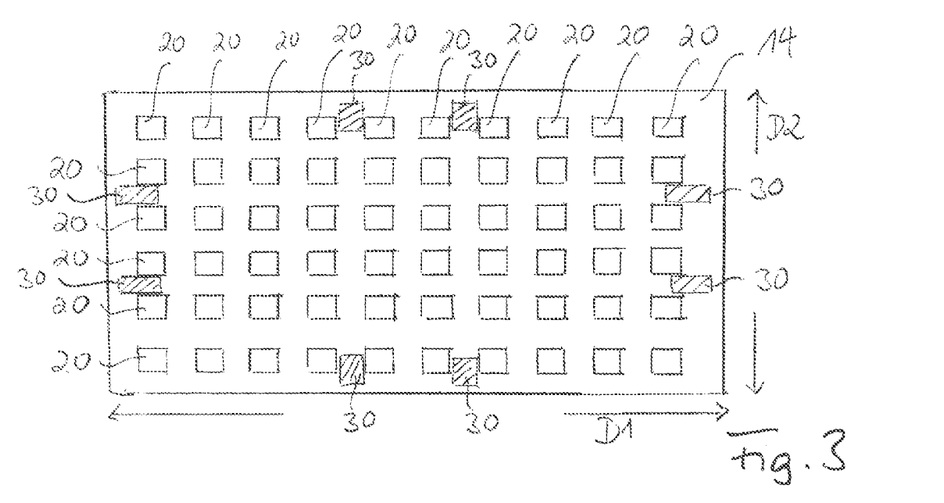
FIG. 3 schematically illustrates a top view of a sensor chip having an array of sensing cells in accordance with one embodiment.

FIG. 3 is a schematic top view illustrating an exemplary upper surface 14 of a semiconductor chip 10. The semiconductor chip 10 may comprise an array of sensing cells 20 implemented in the semiconductor chip 10. The array of sensing cells 20 may be arranged in rows and columns. By way of example, a number of six rows and a number of ten columns may define sixty sensing cells 20 at intersections thereof. Each sensing cell 20 may comprise an integrated circuit. The integrated circuits of all sensing cells may optionally have the same integrated circuit design. The integrated circuits of adjacent sensing cells may be spaced apart from each other according to the array design shown in FIG. 3. Further, a number of contact pads 30 may be provided at the upper surface 14, e.g., surrounding the semiconductor chip 10 in a peripheral region thereof. Interconnecting wiring (not shown) may be routed within the gaps between adjacent sensing cells 20 to connect sensing cells 20, e.g., to the contact pads 30 or to other integrated circuitry (not shown) such as, e.g., controller, microprocessor, memory, etc.

The semiconductor chip 10 may have a first lateral dimension D1 and a second lateral dimension D2. The first lateral dimension D1 extends along the length of the rows, and the second lateral extension D2 extends along the length of the columns. By way of a specific example, D1 may be 2.93 mm and D2 may be 1.81 mm. More generally, each of the dimensions D1 and D2 may be one to several millimeters. Further, in some embodiments all sensing cells 20 may be of same cell integrated circuit design.

Figure 4:
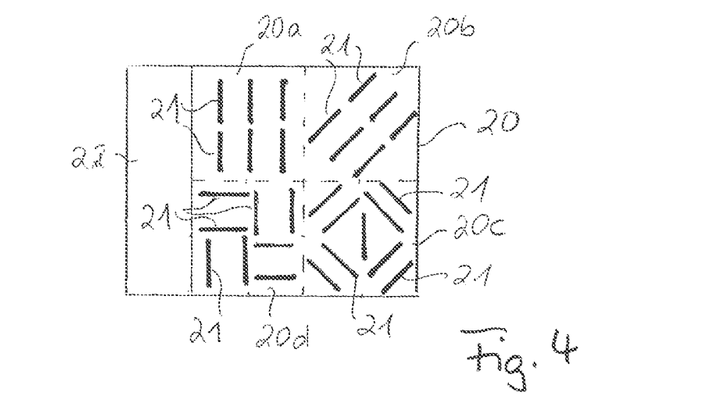
FIG. 4 schematically illustrates a top view of a sensing cell in accordance with one embodiment.

FIG. 4 is an illustration of an exemplary sensing cell 20. By way of example, the sensing cell 20 may comprise a plurality of channel transistors. At least some of the channel transistors may be oriented in different directions. By way of example, one or more channel transistors may have a channel oriented, e.g., in [010] direction, whereas one or more other channel transistors may have a channel oriented, e.g., in [100] direction.

More specifically, by way of example, FIG. 4 displays a sensing cell 20 partitioned in four sensing zones 20*a*, 20*b*, 20*c*, 20*d* and one (optional) evaluation circuitry zone 22. By way of example, the sensing zones 20*a*, 20*b*, 20*c*, 20*d* may be, e.g., of rectangular shape and may be, e.g., of similar area. As depicted in FIG. 4, each of the sensing zones 20*a*, 20*b*, 20*c*, 20*d* may have an unique pattern of channel 21 orientations. Further, sensing zones 20*c*, 20*d* may comprise at least two channel transistors having channels 21 oriented to each other under an angle different from 0° (i.e., channels 21 which are not parallel). More specifically, the channels 21 of the at least two transistors may be, e.g., oriented to one another under an angle of, e.g., 45°, 90°, 135°, 180°, etc.

Figure 5:
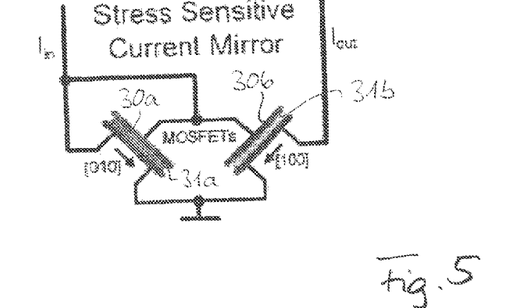
FIG. 5 schematically illustrates a circuit diagram of an exemplary measuring circuitry in accordance with one embodiment.

FIG. 5 illustrates a circuit diagram of an exemplary sensing circuitry in accordance with some embodiments. Two channel transistors 30*a*, 30*b* are shown. The channel of channel transistor 30*a* is denoted by reference numeral 31*a*, and the channel of channel transistor 30*b* is denoted by reference numeral 31*b*. Channels 31*a* and 31*b* are not parallel to each other, as mentioned above. As exemplified in FIG. 5, channel 31*a* may be oriented in [010] direction and channel 31*b* may be oriented in [100] direction. The channel transistors 30*a*, 30*b* may e.g. be fabricated in CMOS technology. They may, e.g., be MOSFETs.

The channel transistors 30*a*, 30*b* may be interconnected by the sensing circuitry. By way of example, as exemplified in FIG. 5, the sensing circuitry may be configured to represent a current mirror. A current mirror may be a current source controlled by a current. More specifically, if a basic current minor as depicted in FIG. 5 is used, an input current Iin flows through the first channel transistor 30*a* and an output current Iout flows through the second channel transistor 30b. The source of the first channel transistor 30a is connected to the gates of the first and second channel transistors 30a, 30b. The channels 31a, 31b of channel transistors 30a, 30b, respectively, may have identical dimensions (length) and the channel transistors 30a, 30b may be fabricated by using the same MOS technology. In this case, assume idle behavior, Iin=Iout. However, a modulation of channel length causes deviation from ideality, i.e. an offset between Iin and Iout. Thus, strain is introduced into a sensing region in which the first and second channel transistors 30a, 30b are implemented, that may cause a channel length modulation of channels 31a, 31b. However, if both channels 31a, 31b are arranged to be inclined to each other, lattice strain in the sensing region may cause a non-uniform channel length modulation of the two channels 31a, 31b. Therefore, a quantity derived by a comparison of Iin and Iout (e.g., a ratio or a difference thereof) may be indicative of the amount stress and/or a direction of stress loaded on the sensing region 11 (and possibly causing corresponding lattice strain in the sensing region 11). Thus, the sensing circuitry such as, e.g., the current minor shown in FIG. 5 is stress sensitive. Evaluating Iin and Iout by an evaluation circuitry, which may, e.g., be implemented in evaluation circuitry zone 22, may be operable to derive a measurement quantity indicative of the amount and/or direction of stress sensed by the pillar 12 or array of pillars 12.

It is to be noted that sensing zones 20a, 20b, 20c, 20d of different integrated circuit designs may improve the sensitivity of the sensing region 11 and may improve the resolution of and discrimination between the directional response or/and the absolute value response of the sensing cells 20.

Further, it is to be noted that a plurality of sensing circuitry (e.g., current mirror) responses may be evaluated by the evaluation circuitry located, e.g., in the evaluation circuitry zone 22.

Instead of a basic current minor as depicted in FIG. 5, other sensing circuitry may be used. By way of example, more sophisticated current minors such as, e.g., a cascade current minor or a Wilson current minor could be used. Further, sensing circuitry which is not based on the current mirror principle may also be implemented.

The meaning of the term sensing region 11 as used herein is intended to comprise one or more sensing cells 20 and each sensing cell 20 may comprise one or more sensing zones 20a, 20b, 20c, 20d. Across a sensing cell 20, the stress applied to the sensing region 11 may be assumed to be approximately uniform, and the lattice strain or deformation may also be assumed to be approximately uniform. Therefore, in some embodiments, a sensing cell 20 may be taken to represent the granularity of stress measurements across the semiconductor upper surface 14 area, and multiple sensing zones 20a, 20b, 20c, 20d may be used to increase resolution/discrimination of the measurement response.

In some embodiments the sensing cells 20 may be independent from each other. Thus, each sensing cell 20 may provide a measurement value indicative of the magnitude and/or the direction of stress which is different to the corresponding measurement values derived by other sensing cells 20. Thus, by way of example, each sensing cell 20 may be configured to only derive one stress measurement value associated with the entire cell (of course, if stress applied by strain induced in the sensing cell 20 is not uniform, this measurement value may be an average value or accuracy may suffer from the stress or strain variation across the area of the sensing cell 20). In some embodiments, each sensing zone 20a, 20b, 20c, 20d may be configured to provide an individual measurement value indicative of the magnitude and/or the direction of stress which is different to the corresponding measurement values derived by other sensing cells 20. These individual measurement values may either be evaluated zone-wise or cell-wise by an evaluation circuitry as described above. If a zone-wise evaluation is used, the finest granularity of stress measurement across the semiconductor upper surface area may correspond to a sensing zone 20a, 20b, 20c, 20d rather than to a sensing cell 20.

In one embodiment at least one or more pillars 12 are bonded to the area defined by each sensing cell 20. However, it is also possible that the array of sensing cells 20 is denser than the array of pillars 12. In this case, in average, a fraction of one pillar 12 may be associated with one sensing cell 20.

In other words, the ratio of the number of sensing cells 20 and pillars 12 may be smaller than 1, may be 1 or may be greater than 1, depending on the lateral dimensions and the pitch of the respective array structures.

Figure 6:
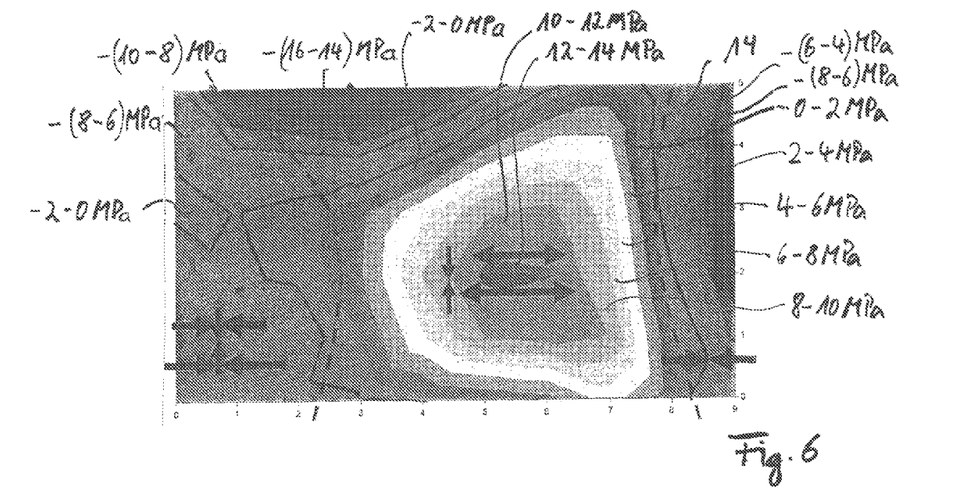
FIG. 6 schematically illustrates the distribution of differential stress across a semiconductor chip surface.

FIG. 6 schematically illustrates the distribution of differential stress $\sigma_{xx}-\sigma_{yy}$ across the upper semiconductor chip surface 14. The differential stress $\sigma_{xx}-\sigma_{yy}$ has been introduced by an array of pillars 12 as shown in FIG. 2. Differential stress $\sigma_{xx}-\sigma_{yy}$ is measured in MPa and is the difference of the stress tensor elements $\sigma_{xx}$ and $\sigma_{yy}$. As known in the art, the stress tensor has the diagonal elements $\sigma_{xx}$, $\sigma_{yy}$, and $\sigma_{zz}$, wherein the x direction and the y direction extend in the plane defined by the upper chip surface 14 along dimensions D1 and D2, respectively, and the z direction is the direction normal to the plane defined by the upper chip surface 14. As illustrated by FIG. 6, the differential stress $\sigma_{xx}-\sigma_{yy}$ introduced by the pillars 12 can vary significantly across the upper semiconductor chip surface 14. By way of example, whilst differential stress in a central region of the semiconductor chip may reach positive values as high as 12-14 MPa, differential stress may relax in the radial direction to have negative values as high as—(14-12) MPa in a peripheral chip region.

Figure 7:
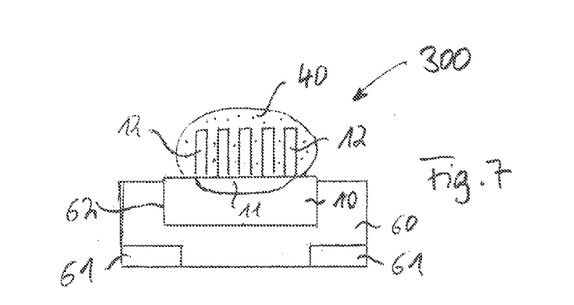
FIG. 7 schematically illustrates a cross-sectional view of a sensor device in accordance with one embodiment.

FIG. 7 illustrates a cross-sectional view of a sensor device 300 in accordance with one embodiment. Sensor device 300 may comprise a semiconductor chip 10 and an array of pillars 12 as described above. Further, a body 40 of a certain mass is couple to the pillars 12. By way of example, the body 40 may be made of a gel, a liquid, e.g., water, oil, etc. In one embodiment the body 40 may largely or completely cover the pillars 12. The body 40 attributes a specific mass to the system. The mass may act as an inertial or seismic mass in accordance with specific applications. Thus, sensor device 300 may, e.g., represent an acceleration sensor. In this case, depending on the mass of the body 40, the pillars 12 are deflected upon acceleration, wherein the direction of acceleration translates into the direction of deflection of pillars 12 and causes (differential) stress introduced into the sensing region 11 of the semiconductor chip. As described above, this differential stress causes lattice strain in the channels 31a, 31b of channel transistors 30a, 30b. Thus, the amount and the direction of acceleration can be measured by sensor device 300.

Sensor device 300 may be accommodated in a package 60. The package 60 may be a surface mounted package having electrodes 61 at the bottom. The semiconductor chip 10 may be mounted, e.g., glued, into a recess 62 of the package 60. By way of example, the package 60 may be made of a pre-fabricated plastic casing or may be made of an encapsulate such as, e.g., a resin molded onto the semiconductor chip 10.

Figure 8:
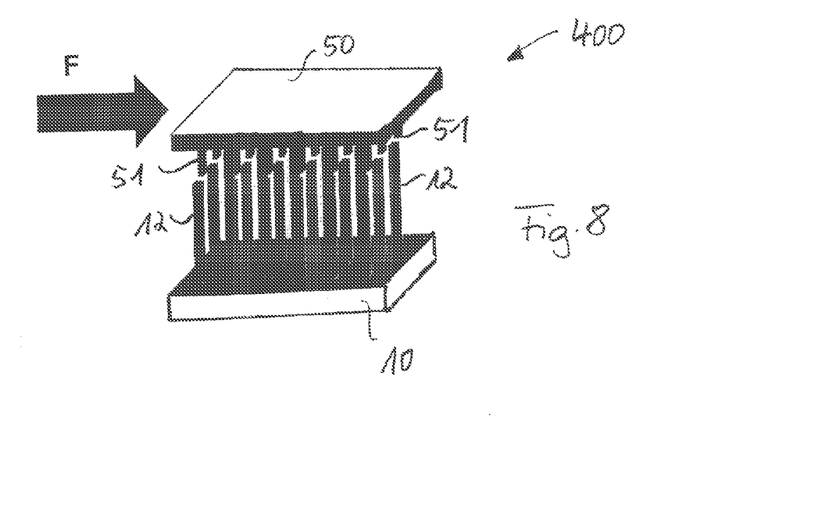
FIG. 8 schematically illustrates a perspective view of a sensor device in accordance with one embodiment.

FIG. 8 schematically illustrates a perspective view of a sensor device 400 in accordance with one embodiment.

Semiconductor device 400 may comprise a semiconductor chip 10 and an array of pillars 12 bonded to the semiconductor chip 10 similar to sensor device 300. Further, sensor device 400 may comprise a structure element or member 50. The member 50 may have the shape of a plate. The member 50 may, e.g., have similar dimensions as the semiconductor chip 10. By way of example, member 50 may be a plate of thickness between 100 μm and 2 mm, and of lateral dimensions in the order of one to several mm.

As depicted in FIG. 8, the member 50 may be equipped with one or more element(s) configured to engage with the ends of the pillars 12 remote to the semiconductor chip 10. This element or elements will be referred to in following as engaging element(s) 51. By way of example, engaging elements 51 may be formed by an array of engaging pillars similar to the pillars 12 of the array of pillars bonded to the semiconductor chip 10. When the member 50 is placed on the array of pillars 12, the engaging elements 51 may engage or hook with the pillars 12. In engagement, a movement of the member 50 is transferred to the pillars 12. In one embodiment, the member 50 may be movable relative to the semiconductor chip 10 in a lateral dimension (i.e., in x and/or in y direction).

The engaging element 51 may also be implemented by means other than engaging pillars. By way of example, an adhesive or a gel may be used as an engaging element. In this case, the adhesive or gel is applied to a lower surface of member 50 facing the semiconductor chip 12. When the member 50 is placed on the array of pillars 12, the adhesive or gel fixedly secures the ends of the pillars 12.

Sensor device 400 may be used in many applications. By way of example, sensor device 400 may be used as a strain measurement device. By way of example, in this case, the sensor device 400 may be attached to a workpiece, with the movable member 50 being fixed to one location of the workpiece and another part of the package, which is firmly positioned in relation to the semiconductor chip 10, is fixed to another location of the workpiece. That way expansion or contraction of the workpiece under examination may be measured between the two locations. By way of example, thermal expansion, aging, deterioration (information about microcracks) etc., of a workpiece such as, e.g., a wing of an aircraft may be monitored by using this or similar techniques.

Figure 9:
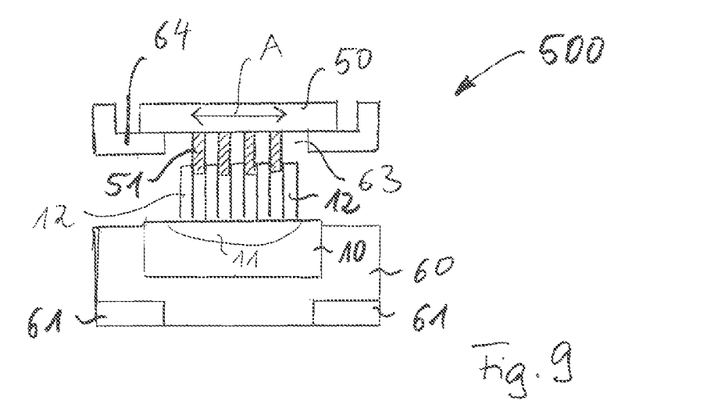
FIG. 9 schematically illustrates a cross-sectional view of a sensor device in accordance with one embodiment.

By way of example, member 50 may be a movable package feature. FIG. 9 illustrates a sensor device 500 representing an exemplary implementation thereof. By way of example, a package similar to the package 60 described in conjunction with FIG. 7 may be used to accommodate the semiconductor chip 10. Reiteration of this description is omitted for the sake of brevity. Further, member 50 may be exposed at an outside of the package 60. By way of example, member 50 may be slidably mounted in an opening 63 of the package 60 and may, e.g., be guided on frame-like edge portions 64 of the opening 63. In this case, member 50 may either be movable in one predetermined direction (e.g., in the direction as indicated by arrow A in FIG. 9) or may be movable in all directions defined by a plane extending parallel to the member 50 and/or to a plane oriented parallel to the upper surface 14 of the semiconductor chip 10, i.e., in x-y direction.

Any movement or displacement of member 50 is transferred via the engaging element(s) 51 to the ends of the pillars 12 remote from the semiconductor chip 10. Then, as described above, the deflection of pillars 12 causes directional stress to be introduced into a sensing region 11 of the semiconductor chip 10 to generate lattice strain.

Figure 10:
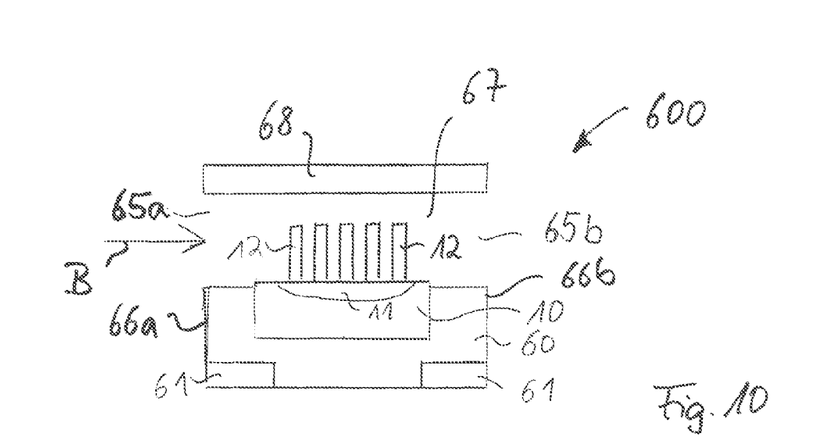
FIG. 10 schematically illustrates a cross-sectional view of a sensor device in accordance with one embodiment.

FIG. 10 illustrates a sensor device 600 in cross-sectional view. Semiconductor chip 10 may be accommodated in a package 60. The package 60 has been described above, and reference is made to this description. Further, the package 60 may have openings 65a, 65b at opposite side faces 66a, 66b, respectively. The openings 65a, 65b are connected by a channel 67 passing through the package 60 from one opening 65a to the other opening 65b. The channel 67 may be closed at the top of the package 60 by a package top wall 68. The package top wall 68 may extend substantially coplanar to the upper surface 14 of the semiconductor chip 10.

The pillars 12 or array of pillars 12 are configured to protrude into the channel 67. In one embodiment the ends of the pillars 12 remote to the semiconductor chip 10 are disengaged with the package top wall 68, as, e.g., illustrated in FIG. 10.

The sensor 600 illustrated in FIG. 10 may e.g. implement a flowmeter for fluids, e.g., liquids or gasses. As indicated by the arrow B, a fluid may pass through channel 67 from opening 65a to opening 65b. Depending on the viscosity, density, velocity and other characteristics of the fluid, the fluid will cause the pillar(s) 12 to bend in the direction of fluid flow. Then, depending on the stiffness, length, diameter and other quantities of the pillar(s), stress is transferred to the sensing region 11 of the semiconductor chip 10.

As mentioned earlier, sensing circuitry such as, e.g., current minors and/or evaluation circuitry such as, e.g., logic circuitry, programmable units, a micro-controller or a processor, may be implemented in semiconductor chip 10 to process the electrical signals obtained by sensing the (e.g., differential) stress distribution in the sensing region 11 of the semiconductor chip 10.

Figure 11:
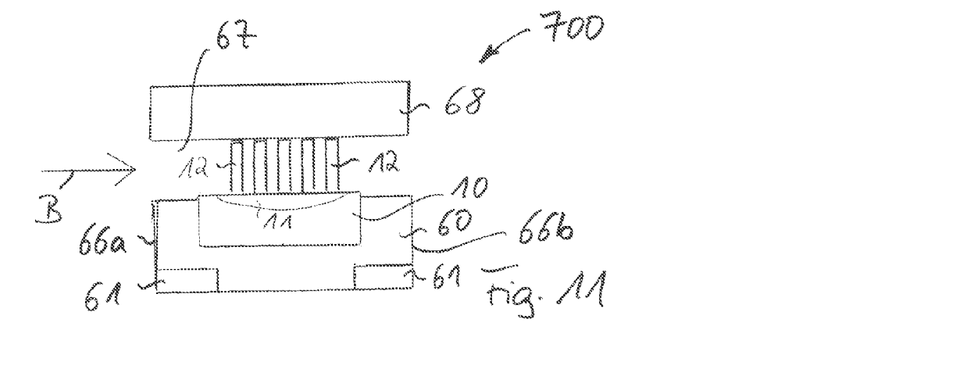
FIG. 11 schematically illustrates a cross-sectional view of a sensor device in accordance with one embodiment.

FIG. 11 schematically illustrates a cross-sectional view of a sensor device 700 in accordance with one embodiment. Sensor device 700 may be similar to sensor device 600, with the exception that the end(s) of the pillar(s) 12 remote from the semiconductor chip 10 are fixed in position at the package top wall 68. That way, the pillar(s) 12 are fixed at both ends. In this case, a fluid flow as explained above in conjunction with FIG. 10 will only cause an overall bias on the whole system.

Except for fixedly securing the remote ends of the pillar(s) 12 at the package top wall 68, the sensor device 700 may be identical to sensor device 600. In order to avoid reiteration, reference is made to the disclosure of sensor device 600.

Sensor device 700 may be used in various applications. By way of example, sensor device 700 may be used as a particle counter. When a particle hits a single pillar 12, the impact may cause a stress pulse occurring at the pillar 12. This stress pulse is transferred to the sensing region 11 and may be detected. By way of example, detected stress pulses may be counted and the count number may be divided by time in order to generate a quantity which is indicative of the number of particles per time passing through the channel 67.

It is to be noted that each of the sensor devices 600 and 700 may be used as a flowmeter or a particle counter or a combined flowmeter and particle counter, because the effects caused by fluid flows and particles occur in both sensor devices 600, 700. These effects may be discriminated in both sensor devices 600 and 700 based on the different time characteristics, e.g. time constants, of the respective effects. However, sensor device 600 may be more sensitive to measure flows than sensor device 700, and sensor device 700 may be more sensitive to measure particle counts than sensor device 600.

Figure 12:
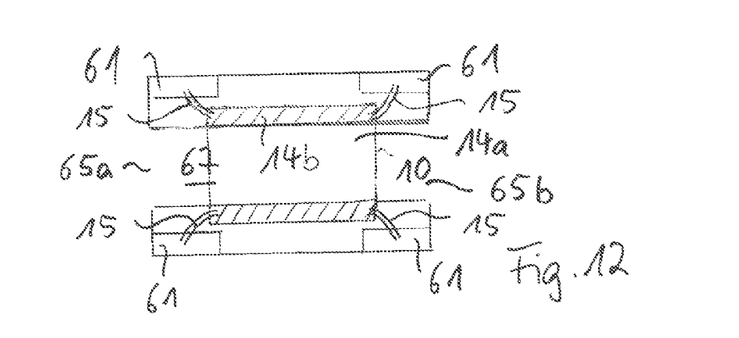
FIG. 12 schematically illustrates a top view of a sensor device in accordance with one embodiment.

FIG. 12 illustrates by way of example a top view of sensor device 600, 700 with removed package top wall 68 in accordance with some embodiments. As is apparent in FIG. 12, the channel 67 may extend only over a central part 14a of the upper surface 14 of the semiconductor chip 10. That way, peripheral zones 14b of the upper surface 14 of the semiconductor chip 10 may be configured to be not exposed to the interior of the channel 67. These peripheral zones 14b may e.g. be covered be the material of the package (and are therefore illustrated as hatched areas). They may, e.g., be used for features protected against the measurement environment, e.g., against fluids or particles flowing through the channel 67. By way of example, contact elements such as, e.g., wire bonds 15 may be located in peripheral zones 14b. Further, in some embodiments, peripheral zones 14b may accommodate the evaluation circuitry zone 22.

Figure 13:
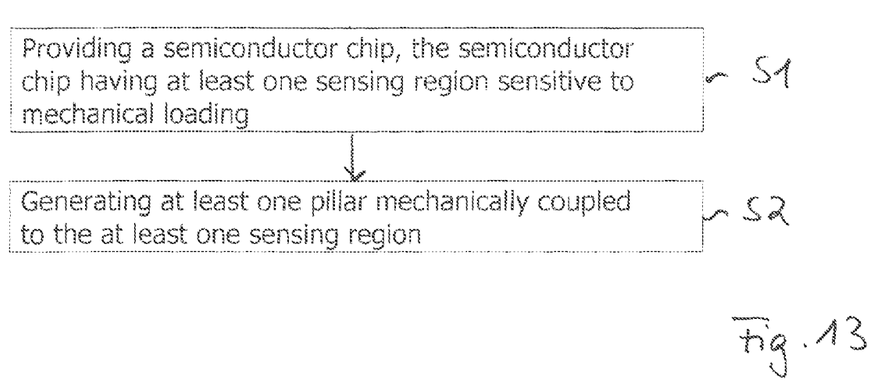
FIG. 13 illustrates a method of manufacturing a sensor device in accordance with one embodiment.

A method in accordance with the disclosure is illustrated in FIG. 13. The method comprises providing a semiconductor chip, the semiconductor chip 10 having at least one sensing region 11 sensitive to mechanical loading at S1.

At S2, at least one pillar is mechanically coupled to the at least one sensing region. As described above, this may comprise depositing a material over at least a part of a surface of the semiconductor chip which comprises the sensing region and structuring the material to form the at least one pillar.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. This application is intended to cover any adaptations or variations of the specific embodiments discussed herein, and the invention is intended to be limited only by the claims and the equivalence thereof.

What is claimed is:

1. A sensor device comprising:
a semiconductor chip having at least one sensing region sensitive to a mechanical loading, the at least one sensing region being located in a bulk part of the semiconductor chip adjacent to an upper surface of the semiconductor chip, wherein a transistor having a channel region is embedded in the at least one sensing region; and
at least one pillar fixedly secured to the bulk part of the semiconductor chip at the at least one sensing region, the at least one pillar being arranged on the upper surface of the semiconductor chip directly above the at least one sensing region, wherein the at least one pillar has an aspect ratio between 5 and 40, and wherein the at least one pillar is configured to mechanically introduce an external stress generated by a forced lateral deflection of the at least one pillar into the channel region of the transistor which induces a deformation in a semiconductor lattice in the channel region which varies an electrical characteristic of the channel region.

2. The sensor device of claim 1, further comprising:
a first transistor embedded in the at least one sensing region; and
a second transistor embedded in the at least one sensing region, the first and the second transistors having different orientations.

3. The sensor device of claim 1, wherein the semiconductor chip comprises an array of sensing cells located in the at least one sensing region.

4. The sensor device of claim 3, wherein each sensing cell of the array of sensing cells comprises an integrated circuit.

5. The sensor device of claim 1, wherein the transistor is a CMOS transistor having channel dimensions configured to vary with the mechanical loading.

6. The sensor device of claim 1, wherein the at least one pillar comprises a dielectric material.

7. The sensor device of claim 6, wherein the at least one pillar comprises a photoresist.

8. The sensor device of claim 1, wherein the at least one pillar comprises a metal material.

9. The sensor device of claim 1, further comprising a body embedding the at least one pillar.

10. The sensor device of claim 1, further comprising a structure element mechanically coupled to an end of the at least one pillar, the end being remote from the at least one sensing region.

11. The sensor device of claim 10, wherein the structure element comprises a first surface facing the semiconductor chip, and wherein at least one engaging element is configured to be mechanically coupled to the end of the at least one pillar.

12. The sensor device of claim 10, wherein the structure element is configured to be movable relative to the semiconductor chip.

13. The sensor device of claim 10, wherein the structure element is configured to be fastened to a position relative to the semiconductor chip.

14. The sensor device of claim 1, wherein the sensor device comprises a force sensor, an acceleration sensor, a flow rate sensor, or a particle counter.

15. The sensor device of claim 1, wherein the at least one pillar consists of a dielectric material.

16. A method of manufacturing a sensor device, the method comprising:
providing a semiconductor chip having at least one sensing region sensitive to mechanical loading, the at least one sensing region being located in a bulk part of the semiconductor chip adjacent to an upper surface of the semiconductor chip, wherein a transistor having a channel region is embedded in the at least one sensing region;
depositing a material over at least a part of the upper surface of the semiconductor chip, the part of the upper surface comprising the at least one sensing region; and
structuring the material thereby forming at least one pillar fixedly secured to the bulk part of the semiconductor chip at the at least one sensing region, wherein the at least one pillar is arranged on the upper surface of the semiconductor chip directly above the at least one sensing region so as to mechanically introduce an external stress generated by a forced lateral deflection of the at least one pillar into the channel region of the transistor which induces a deformation in a semiconductor lattice in the channel region which varies an electrical characteristic of the channel region, and wherein the at least one pillar has an aspect ratio between 5 and 40.

17. The method of claim 16, wherein the structuring comprises etching the material.

18. The method of claim 16, further comprising mechanically coupling a structure element to the at least one pillar at an end thereof, the end being remote from the at least one sensing region.

* * * * *